(12) United States Patent
Lai et al.

(10) Patent No.: US 9,899,260 B2
(45) Date of Patent: Feb. 20, 2018

(54) METHOD FOR FABRICATING A SEMICONDUCTOR DEVICE

(71) Applicant: Micron Technology, Inc., Boise, ID (US)

(72) Inventors: Ching-Hua Lai, New Taipei (TW); Chien-Hung Shih, New Taipei (TW); Ting-Chung Chiu, New Taipei (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/002,404

(22) Filed: Jan. 21, 2016

(65) Prior Publication Data

US 2017/0213764 A1 Jul. 27, 2017

(51) Int. Cl.
*H01L 21/44* (2006.01)
*H01L 21/768* (2006.01)
*H01L 21/683* (2006.01)
*H01L 21/306* (2006.01)
*H01L 23/00* (2006.01)

(52) U.S. Cl.
CPC .. *H01L 21/76898* (2013.01); *H01L 21/30625* (2013.01); *H01L 21/6835* (2013.01); *H01L 21/76831* (2013.01); *H01L 21/76883* (2013.01); *H01L 24/11* (2013.01); *H01L 2221/68327* (2013.01); *H01L 2221/68381* (2013.01); *H01L 2224/13024* (2013.01)

(58) Field of Classification Search
None
See application file for complete search history.

(56) References Cited

U.S. PATENT DOCUMENTS

| 7,547,958 | B2* | 6/2009 | Toyoda | H01L 23/3121 257/565 |
| 8,884,440 | B2* | 11/2014 | Kim | H01L 23/481 257/621 |
| 8,952,499 | B2* | 2/2015 | Morimoto | H01L 23/345 257/621 |
| 9,000,495 | B2* | 4/2015 | Yamashita | H01L 22/32 257/276 |
| 2004/0092100 | A1* | 5/2004 | Cheng | H01L 21/7684 438/687 |

(Continued)

FOREIGN PATENT DOCUMENTS

TW 201214627 A1 4/2012
TW 201250971 A 12/2012

(Continued)

OTHER PUBLICATIONS

Taiwanese Office Action and Search Report from Taiwanese Application No. 105107836, dated Feb. 8, 2017, 9 pages.

*Primary Examiner* — David E Graybill
(74) *Attorney, Agent, or Firm* — TraskBritt

(57) ABSTRACT

A method of fabricating a semiconductor device. A wafer having a front side and a back side opposite to the front side is prepared. A plurality of through substrate vias (TSVs) is formed on the front side. A redistribution layer (RDL) is then formed on the TSVs. The wafer is bonded to a carrier. A wafer back side grinding process is performed to thin the wafer on the back side. An anneal process is performed to recrystallize the TSVs. A chemical-mechanical polishing (CMP) process is performed to polish the back side.

13 Claims, 6 Drawing Sheets

(56) References Cited

U.S. PATENT DOCUMENTS

| | | | |
|---|---|---|---|
| 2005/0029669 A1* | 2/2005 | Inoue | H01L 21/76852 257/774 |
| 2009/0020865 A1* | 1/2009 | Su | H01L 21/6836 257/698 |
| 2009/0045487 A1* | 2/2009 | Jung | H01L 21/76898 257/621 |
| 2011/0193199 A1* | 8/2011 | Filippi | H01L 21/76898 257/621 |
| 2012/0061794 A1* | 3/2012 | Sadaka | H01L 23/481 257/503 |
| 2012/0139127 A1 | 6/2012 | Beyne | |
| 2012/0178258 A1* | 7/2012 | Kwon | H01L 21/76898 438/692 |
| 2013/0105213 A1* | 5/2013 | Hu | H05K 3/4038 174/266 |
| 2013/0244420 A1 | 9/2013 | Andry | |
| 2014/0001604 A1* | 1/2014 | Sadaka | H01L 23/473 257/621 |
| 2014/0117545 A1* | 5/2014 | Liu | H01L 23/53238 257/751 |
| 2014/0162449 A1* | 6/2014 | An | H01L 21/76885 438/613 |
| 2014/0235052 A1* | 8/2014 | Park | H01L 21/76898 438/653 |
| 2014/0357077 A1* | 12/2014 | Lee | H01L 21/76898 438/667 |
| 2014/0367828 A1* | 12/2014 | Colonna | H01L 28/40 257/532 |
| 2014/0370703 A1* | 12/2014 | Dai | H01L 21/76898 438/660 |
| 2015/0145144 A1* | 5/2015 | McDonald | H01L 25/0657 257/774 |
| 2015/0364432 A1* | 12/2015 | Chung | H01L 21/4803 257/621 |
| 2016/0111398 A1* | 4/2016 | Hsiao | H01L 24/24 257/534 |

FOREIGN PATENT DOCUMENTS

| | | |
|---|---|---|
| TW | 201305396 | 2/2013 |
| TW | 201401351 | 1/2014 |
| TW | 201413913 A | 4/2014 |
| TW | 201528426 A | 7/2015 |

* cited by examiner

METHOD FOR FABRICATING A SEMICONDUCTOR DEVICE

BACKGROUND OF THE INVENTION

1. Field of the Invention

The present invention relates generally to a semiconductor device, and more particularly to a TSV interposer and a fabrication method thereof.

2. Description of the Prior Art

A through substrate via (TSV) interposer is a device with electrical through vias that is inserted between one or more integrated circuit chips and a mounting substrate. The electrical through vias allow the integrated circuit chips to be electrically connected to the mounting substrate.

As known in the art, the electrical through vias are formed by providing holes in a front side of a silicon substrate, insulating the sidewall of the through holes, filling a conductor metal, such as copper, in the through holes by plating or the like, and then grinding the silicon substrate on its rear side to expose the other ends of the electrical through vias for further connection.

However, the prior art method has some drawbacks, for example, copper extrusion on the exposed ends of the electrical through vias on the rear side of the silicon substrate. Accordingly, there exists a need in the art to overcome the deficiencies described hereinabove.

SUMMARY OF THE INVENTION

In one aspect, the present invention provides a method of fabricating a semiconductor device. A wafer having a front side and a back side opposite to the front side is prepared. A plurality of through substrate vias (TSVs) is formed on the front side. A redistribution layer (RDL) is then formed on the TSVs. The wafer is bonded to a carrier. A wafer back side grinding process is performed to thin the wafer on the back side. An anneal process is performed to recrystallize the TSVs. A chemical-mechanical polishing (CMP) process is performed to polish the back side.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

Figure 1:
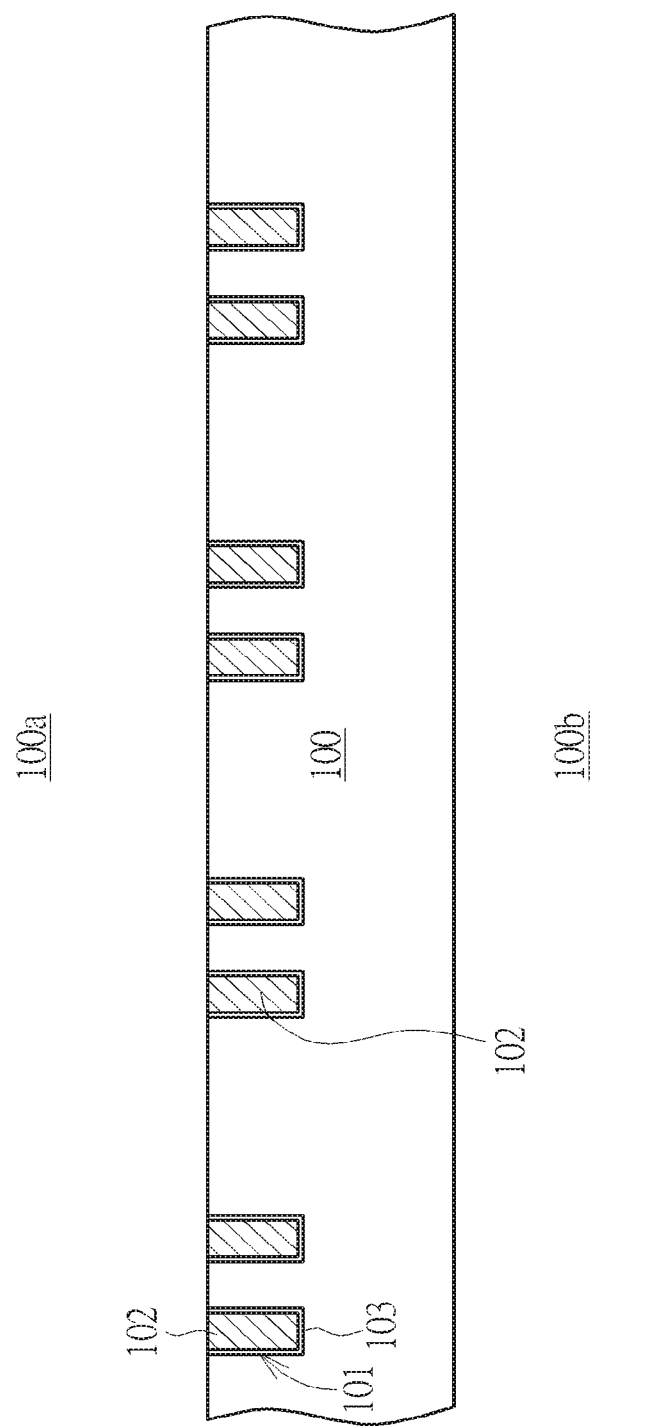
FIG. 1 through FIG. 6 are schematic, cross-sectional diagrams showing an exemplary method for fabricating a semiconductor device according to one embodiment of the invention.

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled. One or more implementations of the present invention will now be described with reference to the accompanying drawings, wherein like reference numerals are used to refer to like elements throughout, and wherein the illustrated structures are not necessarily drawn to scale.

The terms "wafer" and "substrate" used herein include any structure having an exposed surface onto which a layer is deposited according to the present invention, for example, to form a circuit structure such as a redistribution layer (RDL). The term "substrate" is understood to include semiconductor wafers, but not limited thereto. The term "substrate" is also used to refer to semiconductor structures during processing, and may include other layers that have been fabricated thereupon.

FIG. 1 through FIG. 6 are schematic, cross-sectional diagrams showing an exemplary method for fabricating a semiconductor device according to one embodiment of the invention.

As shown in FIG. 1, first, a wafer 100 is provided. The wafer 100 may comprise a silicon interposer wafer, but not limited thereto. The wafer 100 may have an initial thickness that may range between 600 and 800 micrometers, for example, 770 micrometers. The wafer 100 has a front side 100a and a back side 100b.

A plurality of through substrate vias (TSVs) 101 may be formed in the wafer 100 on the front side 100a of the wafer 100. The method for making of the TSVs 101 is well known in the art. For example, to form the TSVs 101, TSV holes are formed on the front side 100a of the wafer 100 to a predetermined depth below a major surface of the wafer 100. An interior surface of each TSV hole may be insulated by a dielectric layer, such as a silicon oxide layer 103. Metals including, but not limited to, diffusion barrier metals and copper 102 are deposited into the TSV holes. The front side 100a of the wafer 100 may be subjected to a polishing process and an anneal process.

Figure 2:
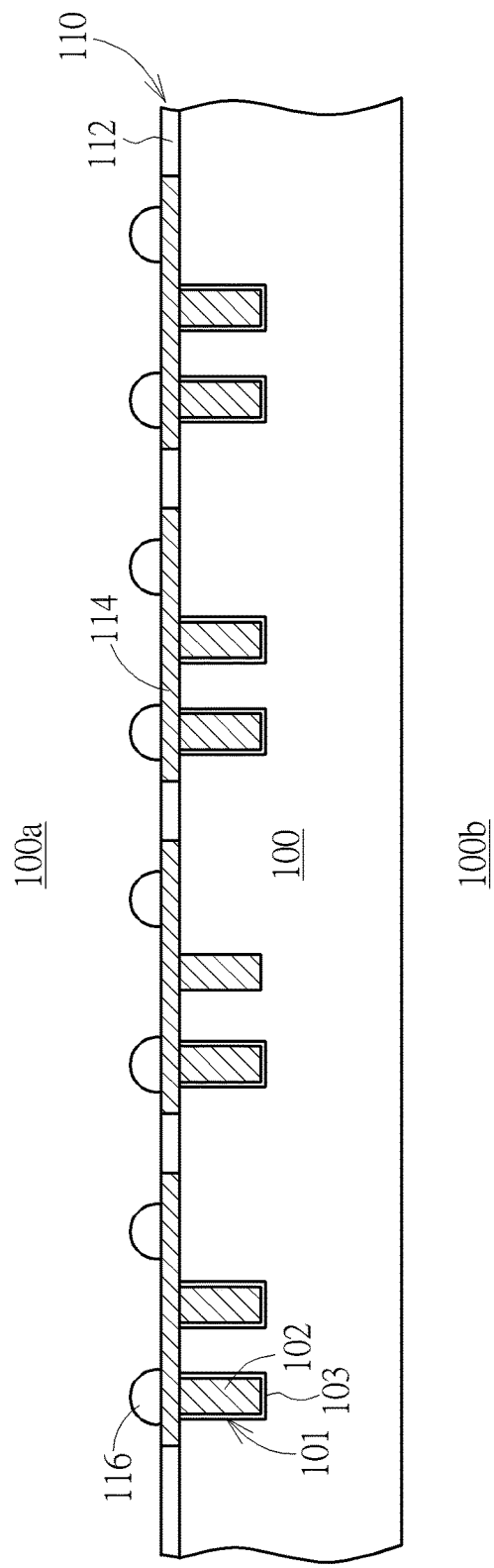

As shown in FIG. 2, according to the illustrated embodiment, a redistribution layer (RDL) 110 may be formed on the front side 100a of the wafer 100. The RDL 110 may comprise at least one dielectric layer 112 and at least one metal layer 114. The TSVs 101 may be connected with the metal layer 114. A plurality of bumps 116 such as microbumps may be formed on the RDL 110 for further connections. The bumps 116 may be directly formed on respective contact pads formed in the metal layer 114.

It is to be understood that the RDL structure as shown in the figures is for illustration purposes only. In some embodiments, the RDL 110 may comprise multiple dielectric layers and multiple metal interconnection features or traces in the multiple dielectric layers. In still another embodiment, semiconductor dies may be mounted on the front side 100a and sealed by a molding compound (not shown).

Figure 3:
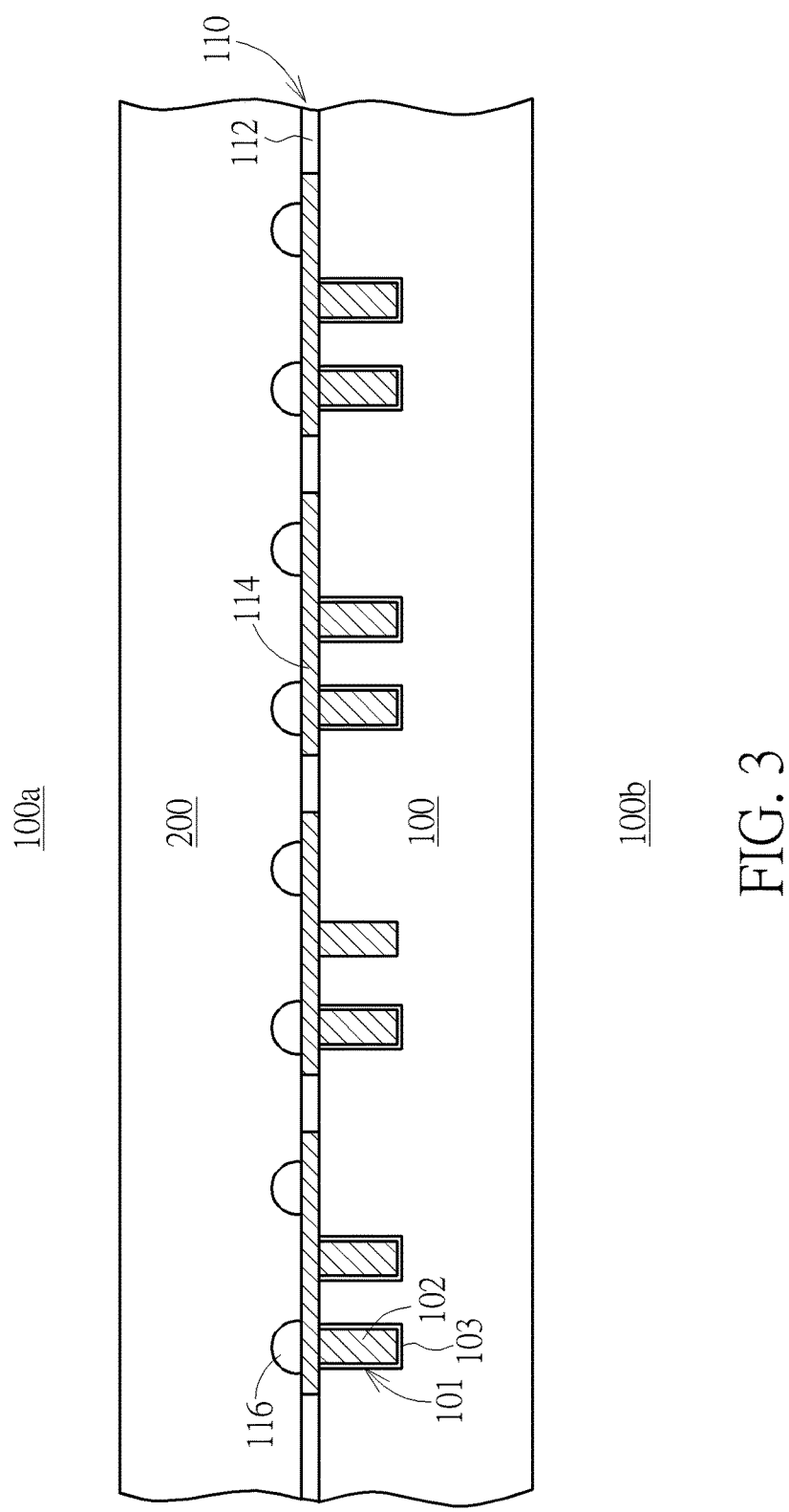

As subsequently shown in FIG. 3, wafer 100 is adhered to a carrier 200. For example, the carrier 200 may be a glass carrier, a silicon carrier, or the like, but is not limited thereto. The bumps 116 face toward, and may contact, the carrier 200. Optionally, an adhesive layer (not explicitly shown) may be used when bonding the carrier 200 with the wafer 100.

Figure 4:
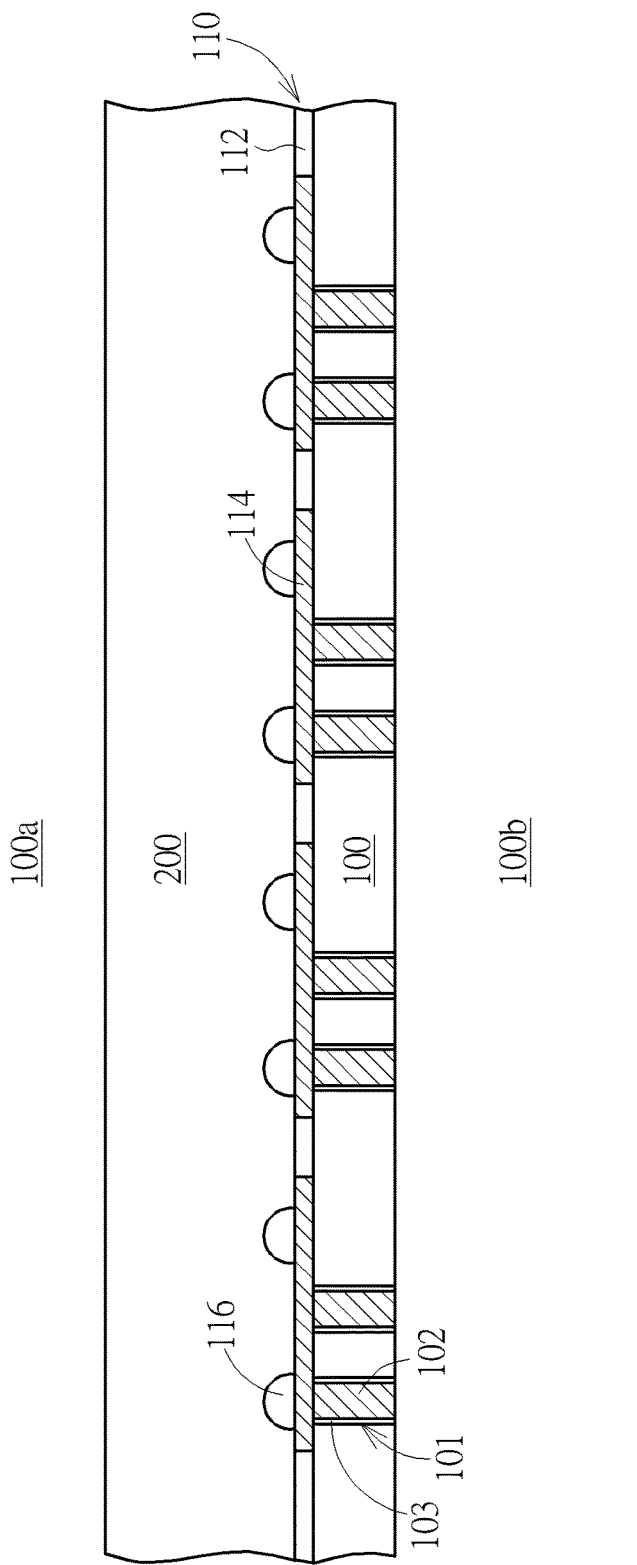

As subsequently shown in FIG. 4, after forming the carrier 200, the back side 100b of the wafer 100 is subjected to a wafer back side grinding process to thin the wafer 100. A portion of the wafer 100 is removed from the back side 100b of the wafer 100. Optionally, chemical-mechanical polishing (CMP) process may be performed to reveal the TSVs 101 from the back side 100b of the wafer 100.

Figure 5:
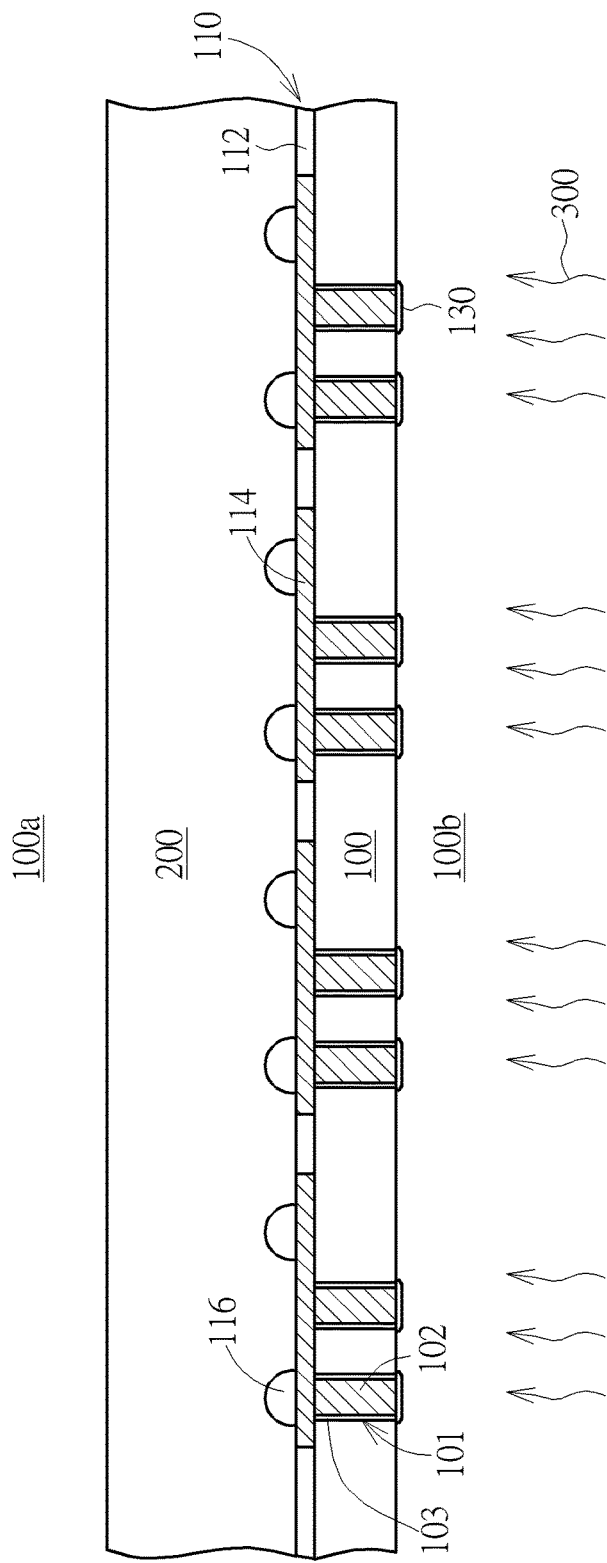

As shown in FIG. 5, the back side 100b of the wafer 100 is then subjected to an anneal process 300 to recrystallize the copper 102 of the TSVs 101 near the back side 100b of the wafer 100. According to the illustrated embodiment, the anneal process 300 is preferably carried out at a temperature of about 200° C. According to the illustrated embodiment, copper extrusion 130 may occur on the exposed ends of the TSVs 101.

Figure 6:
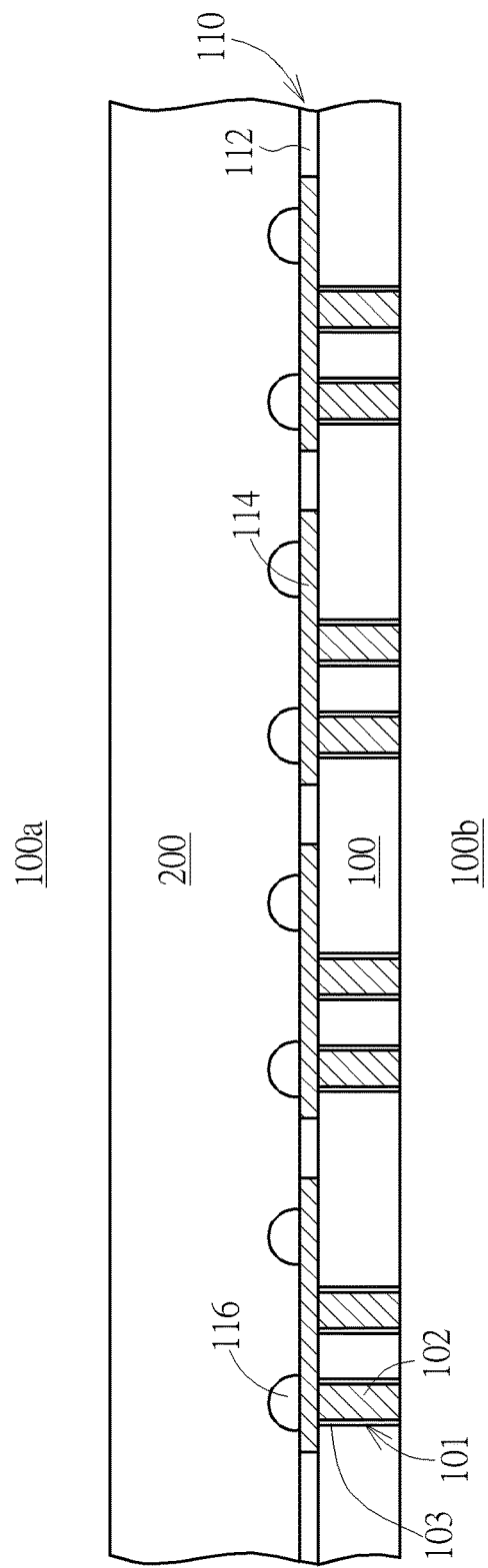

As shown in FIG. 6, the back side 100b of the wafer 100 is then subjected to another CMP process to polish away the copper extrusion 130 from the back side 100b of the wafer 100. Subsequently, a passivation layer (not shown) may be formed on the back side 100b of the wafer 100. Optionally, a redistribution layer may be formed on the back side 100b of the wafer 100. Subsequently, the carrier 200 may be de-bonded.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:
    forming vias extending into a wafer from a front side thereof;
    filling the vias with copper;
    forming a redistribution layer (RDL) consisting of at least one dielectric layer and at least one metal layer comprising traces over the front side of the wafer, the traces connected to the copper filling the vias;
    forming bumps on and connected to contact pads of the traces;
    bonding a front side of the wafer to a carrier;
    performing a grinding process to a back side of the wafer to thin the wafer on the back side to expose an end surface of the copper filling of each of the vias to form through substrate vias (TSVs);
    after the end surface of the copper filling of each of the TSVs is exposed, performing an anneal process to recrystallize the copper filling the TSVs and form a copper extrusion on the end surface of the copper filling of each of the TSVs; and
    performing a chemical-mechanical polishing (CMP) process to polish the back side of the wafer and remove the copper extrusions.

2. The method of fabricating a semiconductor device according to claim 1, wherein forming the vias extending into the wafer from the front side thereof comprises:
    forming holes from the front side of the wafer to a predetermined depth below the front side of the wafer; and
    insulating interior surfaces of the holes with a dielectric layer before filling the holes with copper.

3. The method of claim 1, further comprising performing another CMP process on the back side of the wafer after performing the grinding process and before performing the anneal process.

4. The method of claim 1, wherein the anneal process is carried out at a temperature of about 200° C.

5. The method of claim 1, further comprising de-bonding the carrier from the wafer after performing the CMP process.

6. The method of claim 1, wherein forming vias extending into a wafer from a front side thereof comprises forming vias into a semiconductor wafer.

7. The method of claim 6, further comprising selecting the semiconductor wafer to comprise silicon.

8. The method of claim 1, wherein forming vias extending into a wafer from a front side thereof comprises forming vias into an in-process semiconductor structure.

9. The method of claim 1, wherein forming a redistribution layer (RDL) consisting of at least one dielectric layer and at least one metal layer comprising traces over the front side of the wafer further comprises forming an RDL comprising multiple dielectric layers and at least one of multiple interconnection features and traces in the multiple dielectric layers.

10. The method of claim 1, further comprising selecting the carrier to be a glass carrier or a silicon carrier.

11. The method of claim 1, wherein forming vias extending into a wafer from a front side thereof comprises forming vias extending into a wafer of an initial thickness of between 700 μm and 800 μm.

12. The method of claim 1, further comprising, after performing a chemical-mechanical polishing (CMP) process to polish the back side of the wafer and remove the copper extrusions, forming a passivation layer of the back side of the wafer.

13. The method of claim 1, further comprising, after performing a chemical-mechanical polishing (CMP) process to polish the back side of the wafer and remove the copper extrusions, forming another redistribution layer (RDL) on the back side of the wafer.

* * * * *

UNITED STATES PATENT AND TRADEMARK OFFICE
CERTIFICATE OF CORRECTION

PATENT NO. : 9,899,260 B2  
APPLICATION NO. : 15/002404  
DATED : February 20, 2018  
INVENTOR(S) : Ching-Hua Lai, Chien-Hung Shih and Ting-Chung Chiu It is certified that error appears in the above-identified patent and that said Letters Patent is hereby corrected as shown below:

In the Specification

| | | |
|---|---|---|
| Column 1, | Line 4, | change "BACKGROUND OF THE INVENTION" to --TECHNICAL FIELD-- |
| Column 1, | Line 10, | prior to subtitle "2. Description of the Prior Art" insert title --BACKGROUND-- |
| Column 1, | Line 29, | change "SUMMARY OF THE INVENTION" to --BRIEF SUMMARY-- |
| Column 1, | Line 51, | change "constitute apart of" to --constitute a part of-- |
| Column 3, | Line 5, | change "Optionally, chemical-mechanical" to --Optionally, a chemical-mechanical-- |

Signed and Sealed this  
Third Day of April, 2018

Andrei Iancu  
*Director of the United States Patent and Trademark Office*